United States Patent
Loubet et al.

(10) Patent No.: US 9,601,381 B2
(45) Date of Patent: Mar. 21, 2017

(54) METHOD FOR THE FORMATION OF A FINFET DEVICE WITH EPITAXIALLY GROWN SOURCE-DRAIN REGIONS HAVING A REDUCED LEAKAGE PATH

(71) Applicants: STMicroelectronics, Inc., Coppell, TX (US); STMicroelectronics (Crolles 2) SAS, Crolles (FR)

(72) Inventors: Nicolas Loubet, Guilderland, NY (US); Stephane Monfray, Eybens (FR); Ronald Kevin Sampson, Lagrangeville, NY (US)

(73) Assignees: STMICROELECTRONICS (CROLLES 2) SAS, Crolles (FR); STMICROELECTRONICS, INC., Coppell, TX (US)

( * ) Notice: Subject to any disclaimer, the term of this patent is extended or adjusted under 35 U.S.C. 154(b) by 2 days.

(21) Appl. No.: 14/097,565

(22) Filed: Dec. 5, 2013

(65) Prior Publication Data
US 2015/0162433 A1   Jun. 11, 2015

(51) Int. Cl.
*H01L 27/088* (2006.01)
*H01L 21/8234* (2006.01)
(Continued)

(52) U.S. Cl.
CPC .. *H01L 21/823431* (2013.01); *H01L 21/0217* (2013.01); *H01L 21/02164* (2013.01);
(Continued)

(58) Field of Classification Search
CPC ............ H01L 29/785; H01L 29/66636; H01L 29/7848; H01L 21/823418; H01L 21/823431
See application file for complete search history.

(56) References Cited

U.S. PATENT DOCUMENTS

| | | | |
|---|---|---|---|
| 6,645,797 B1 | 11/2003 | Buynoski et al. | |
| 8,969,974 B2 * | 3/2015 | Liaw | 257/401 |
| 2008/0224183 A1 | 9/2008 | Nawaz | |
| 2008/0237655 A1 | 10/2008 | Nakabayashi et al. | |

(Continued)

OTHER PUBLICATIONS

Hisamoto, Digh, et al: "FinFET—A Self-Aligned Double-Gate MOSFET Scalable to 20 nm," IEEE Transactions on Electron Devices, vol. 47, No. 12, Dec. 2000, pp. 2320-2325.

*Primary Examiner* — Meiya Li
*Assistant Examiner* — Peter M Albrecht
(74) *Attorney, Agent, or Firm* — Gardere Wynne Sewell LLP (57) ABSTRACT

Elongated fins of a first semiconductor material are insulated from and formed over an underlying substrate layer. Elongated gates of a second semiconductor material are then formed to cross over the elongated fins at channel regions, and the gate side walls are covered by sidewall spacers. A protective material is provided to cover the underlying substrate layer and define sidewall spacers on side walls of the elongated fins between the elongated gates. The first semiconductor material and insulating material of the elongated fins located between the protective material sidewall spacers (but not under the elongated gates) is removed to form trenches aligned with the channel regions. Additional semiconductor material is then epitaxially grown inside each trench between the elongated gates to form source-drain regions adjacent the channel regions formed by the elongated fins of the first semiconductor material located under the elongated gates.

23 Claims, 13 Drawing Sheets

(51) Int. Cl.

| | |
|---|---|
| *H01L 29/78* | (2006.01) |
| *H01L 29/66* | (2006.01) |
| *H01L 21/02* | (2006.01) |
| *H01L 21/84* | (2006.01) |
| *H01L 29/10* | (2006.01) |
| *H01L 29/165* | (2006.01) |
| H01L 29/06 | (2006.01) |

(52) U.S. Cl.
CPC .. *H01L 21/02529* (2013.01); *H01L 21/02532* (2013.01); *H01L 21/02573* (2013.01); *H01L 21/823418* (2013.01); *H01L 21/823468* (2013.01); *H01L 21/823481* (2013.01); *H01L 21/845* (2013.01); *H01L 29/1083* (2013.01); *H01L 29/165* (2013.01); *H01L 29/66545* (2013.01); *H01L 29/66795* (2013.01); *H01L 29/785* (2013.01); *H01L 29/7848* (2013.01); *H01L 29/0673* (2013.01)

(56) References Cited

U.S. PATENT DOCUMENTS

| | | | |
|---|---|---|---|
| 2009/0095980 A1* | 4/2009 | Yu et al. | 257/190 |
| 2010/0163971 A1 | 7/2010 | Hung et al. | |
| 2012/0091538 A1* | 4/2012 | Lin | H01L 29/66795 |
| | | | 257/401 |
| 2014/0284667 A1 | 9/2014 | Basker et al. | |
| 2015/0001591 A1* | 1/2015 | Akarvardar et al. | 257/288 |
| 2015/0014773 A1* | 1/2015 | Cheng et al. | 257/349 |
| 2015/0144998 A1* | 5/2015 | Ching | H01L 29/785 |
| | | | 257/190 |

* cited by examiner

METHOD FOR THE FORMATION OF A FINFET DEVICE WITH EPITAXIALLY GROWN SOURCE-DRAIN REGIONS HAVING A REDUCED LEAKAGE PATH

JOINT RESEARCH AGREEMENT

The claimed configurations set forth herein were made as a result of activities undertaken within the scope of a joint research agreement. The parties to the joint research agreement are (1) STMicroelectronics, Inc., (2) Samsung Electronics Company Ltd., 3) GlobalFoundries, Inc., 4) GlobalFoundries Singapore Pte. Ltd. and 5) International Business Machines Corporation.

TECHNICAL FIELD

The present invention relates to integrated circuits and, in particular, to a process for the formation of fin field effect transistor (FinFET)-type integrated circuit devices and a device produced by such a process.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material referred to as a fin. The source and drain regions of the transistor are typically also formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

The fin of a FinFET transistor is typically defined by a mask that is formed on top of a monocrystalline silicon substrate at the position of the fin. The substrate material is then directionally etched where there is no mask, to a determined depth, such that the elongated section defining the fin remains under the mask and is composed of the substrate material. It is desirable to insulate the fin from the active portion of the circuit substrate in order to address concerns with leakage currents.

For fabrication of a FinFET on a bulk substrate, several techniques are known for fabricating an insulating oxide underneath the fin. For example, in the known bottom oxidation through STI (BOTS) technique, barriers are formed on either side and on top of the fin. The integrated circuit wafer is then subjected to an oxidation process which converts a lower portion of the fin, which is not protected by the barriers, to an insulating thermal oxide material which isolates the upper portion of the fin from the underlying substrate material. In another technique, referred to in the art as the silicon on nothing (SON) technique, a bottom portion of the fin formed from silicon-germanium is selectively etched to produce an open region. The open region is then filled with an insulating dielectric material to isolate the fin from the substrate.

With respect to fabrication of a FinFET on a silicon on insulator (SOI) substrate, the fin is patterned in a top semiconductor (for example, silicon or silicon-germanium) layer positioned over an insulating (for example, silicon dioxide) layer located over a bottom semiconductor (for example, silicon) substrate layer. The insulating layer serves to insulate the fin from the bottom semiconductor substrate layer. Reference is made to U.S. Pat. No. 6,645,797, the disclosure of which is incorporated by reference, which teaches a process for realizing a FinFET transistor from an SOI substrate where the fin is electrically insulated from the lower part of the substrate by the intermediate layer of insulating material.

It is also known in the art to form a FinFET transistor with only a partial dielectric isolation of the fin. In this regard, the fin is considered to be partially isolated when only the channel portion of the fin (under the gate) is isolated from the underlying substrate but the source-drain regions are otherwise in contact with the substrate. To achieve this structure, the prior art teaches the removal of the insulated fin material outside of the channel region associated with the overlying gate and then performing a subsequent regrowth, for example using epitaxy, of semiconductor material on either side of the gate to define source and drain regions. The advantage of this fabrication technique is that the epitaxially grown source and drain regions on either side of the gate can add stress to the channel region formed by the fin. However, because these source and drain regions are in contact with the underlying substrate and spread beyond the area occupied by the fins, there is a large surface area through which current leakage to the underlying substrate can occur.

There is accordingly a need in the art, when fabricating FinFET devices with partially isolated fins, to provide for control over the epitaxially grown source and drain regions so as to reduce the area of substrate contact.

SUMMARY

In an embodiment, a method comprises: forming a plurality of elongated fins of a first semiconductor material insulated from an underlying substrate layer by an insulating material; forming plurality of elongated gates of a second semiconductor material which extend to cross over the plurality of elongated fins; forming sidewall spacers on side walls of the elongated gates; forming a protective material covering the underlying substrate layer and defining sidewall spacers on side walls of the elongated fins between the elongated gates; removing the first semiconductor material and insulating material of the elongated fins located between but not under the elongated gates to form a plurality of trenches between the protective material sidewall spacers which each expose the underlying substrate layer; and epitaxially growing additional semiconductor material inside each trench between the elongated gates to form source-drain regions that are adjacent channels formed by the elongated fins of the first semiconductor material located under the elongated gates.

In an embodiment, a FinFET device comprises: a plurality of elongated fins formed of a first semiconductor material and separated from an underlying substrate layer by insulating material, said first semiconductor material defining channels; a plurality of elongated gates formed of a second semiconductor material, said elongated gates extending to cross over the plurality of elongated fins at said channels, wherein said first semiconductor material and insulating material of the elongated fins is not present between the elongated gates; sidewall spacers on side walls of the elongated gates; a protective material covering the underlying substrate layer between the elongated gates and including a plurality of trenches adjacent the channels; and epitaxial semiconductor material inside said plurality of trenches forming source-drain regions that are adjacent said channels.

BRIEF DESCRIPTION OF THE DRAWINGS

For a better understanding of the embodiments, reference will now be made by way of example only to the accompanying figures in which:

FIGS. 1A-14B illustrate process steps in the formation of a FinFET device having a partially dielectric isolated fin.

DETAILED DESCRIPTION OF THE DRAWINGS

Reference is now made to FIGS. 1A-14B which illustrate the process steps in the formation of a FinFET device having a partially dielectric isolated fin and epitaxially grown source-drain regions. The process is applicable to both a silicon-on-insulator (SOI) substrate and a bulk substrate. It will be noted that the illustrations are not necessarily presented to scale.

Figure 1A:
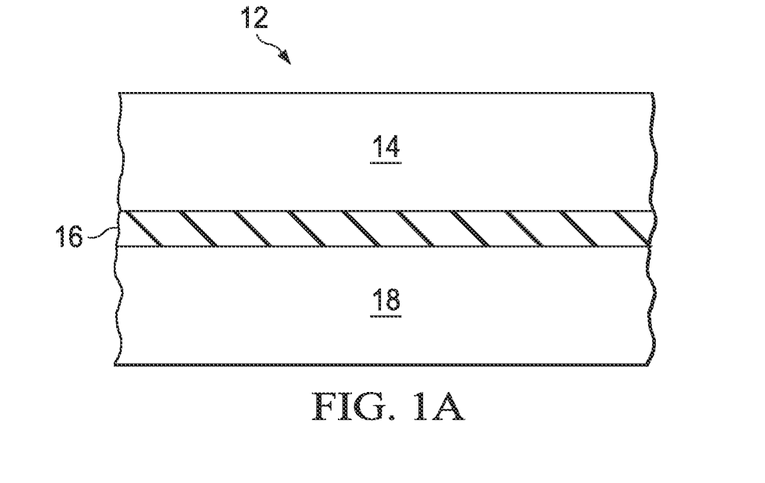

FIG. 1A shows a silicon on insulator (SOI) wafer 12 of a conventional type. For example, the wafer may comprise an ultra-thin body and buried oxide (UTBB) substrate or an extremely thin silicon on insulator (ETSOI) substrate. The substrate wafer 12 comprises a top semiconductor (for example, silicon or silicon-germanium) layer 14 over an insulating (for example, silicon dioxide) layer (BOX) 16 over a bottom semiconductor (for example, silicon) substrate layer 18. With a UTBB substrate, for example, the top semiconductor layer 14 may have a thickness of 5 nm to 10 nm, the insulating layer 16 may have a thickness of 10 nm to 30 nm, and the bottom semiconductor substrate layer 18 may have a thickness of 100 microns to 800 microns. The top semiconductor layer 14 and bottom semiconductor substrate layer 18 may be doped as appropriate for the integrated circuit application. The thickness of the top and bottom semiconductor layers 14 and 18 may be tuned (for example, through the use of a thinning operation) as needed for the integrated circuit application. The top semiconductor layer 14 may, in a preferred embodiment, have a fully depleted (FD) configuration. Although a UTBB substrate is preferred, it will be understood that the substrate could comprise a silicon on insulator (SOI) substrate of any configuration including an extremely thin silicon on insulator (ETSOI) substrate.

Figure 1B:
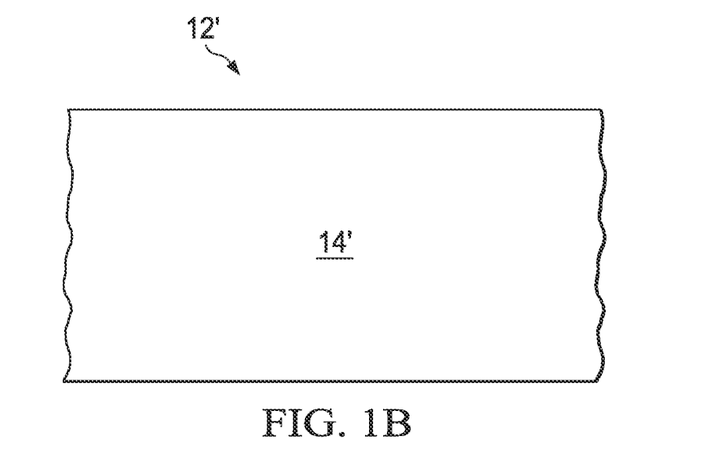

FIG. 1B alternatively shows a starting bulk substrate wafer 12'. The wafer 12' comprises a semiconductor material layer 14' doped as appropriate for the integrated circuit application. The semiconductor material layer 14' may comprise a number of epitaxially grown layers of semiconductor material.

Figure 2A:
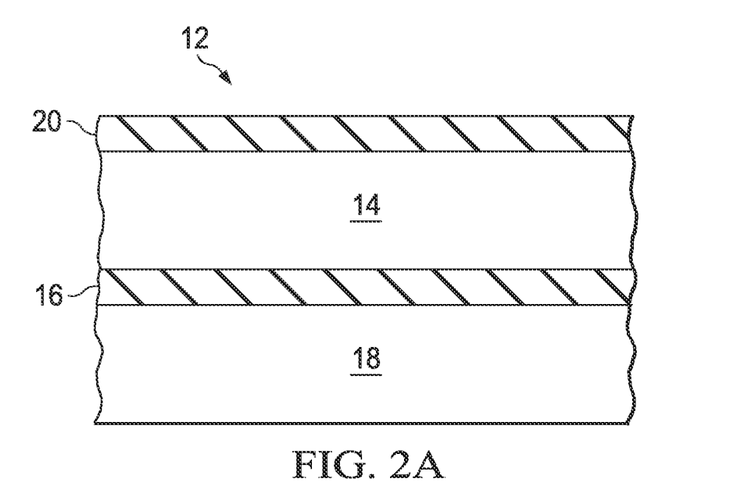
Figure 2B:
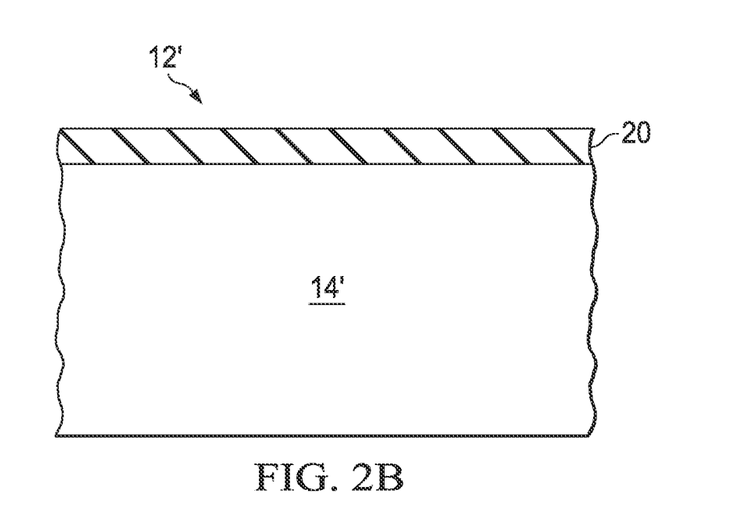

FIG. 2A shows the deposit of a silicon nitride (SiN) layer 20 over the top of the layer 14 of wafer 12, and FIG. 2B shows the deposit of a silicon nitride (SiN) layer 20 over the top of the layer 14' of wafer 12'. This layer 20 may have a thickness of 10 nm to 100 nm and may be deposited using well known process techniques such as PECVD or RTCVD. Although a SiN material is used for masking, it will be understood that the $SiO_2$/SiN hard mask may alternatively be used.

Figure 3A:
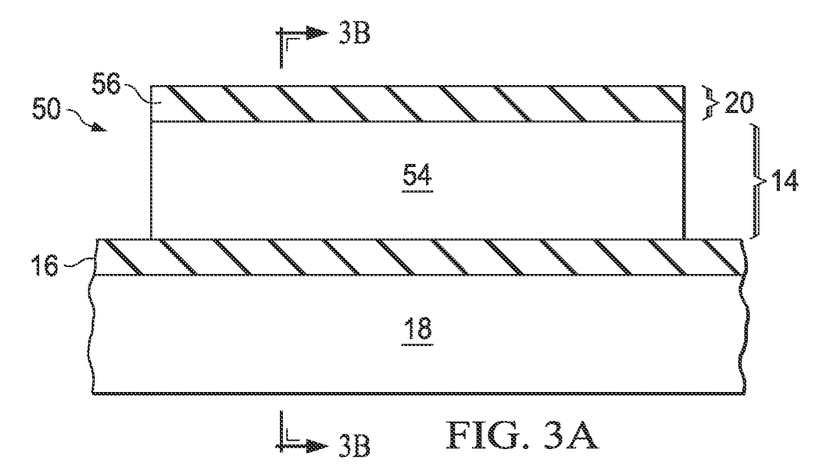
Figure 3B:
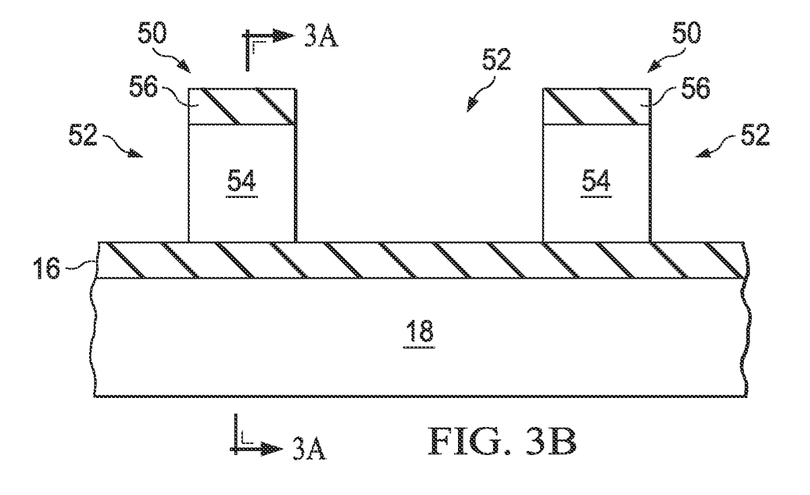

Reference is now made to FIGS. 3A and 3B which illustrate perpendicular cross-sectional views of the wafer 12. A lithographic process as known in the art is then used to define the fins 50 for the FinFET devices. The silicon nitride (SiN) layer 20 applied over the top surface of the top semiconductor layer 14 is lithographically patterned in a manner known in the art to leave SiN mask material at the desired locations of the fins 50. An etching operation is then performed to open apertures 52 in the top semiconductor layer 14 on either side of each fin 50. The apertures 52 further extend to a depth sufficient to reach the insulating layer 16 so as to ensure the fin depth passes completely through the top semiconductor layer 14. Each fin 50 is accordingly formed to include a region 54 made of the top semiconductor layer 14 (with an overlying silicon nitride cap 56) located over the insulating layer 16. In a preferred implementation, the etching process may utilize a sidewall image transfer (SIT) process such as that described, for example, in U.S. Pat. No. 8,298,954, the disclosure of which is incorporated by reference.

Figure 3C:
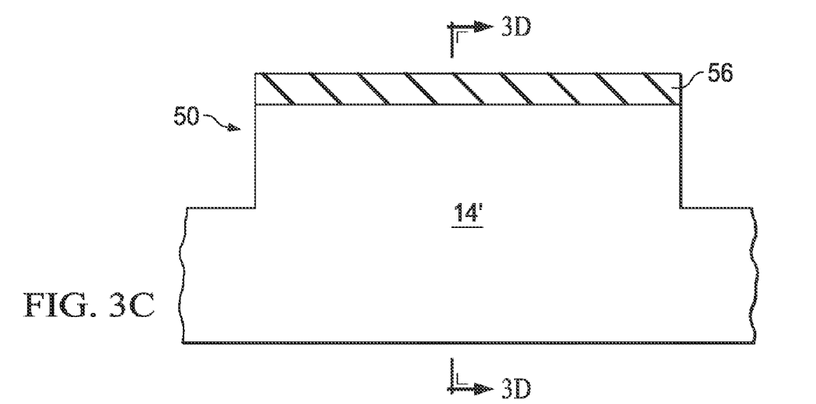
Figure 3D:
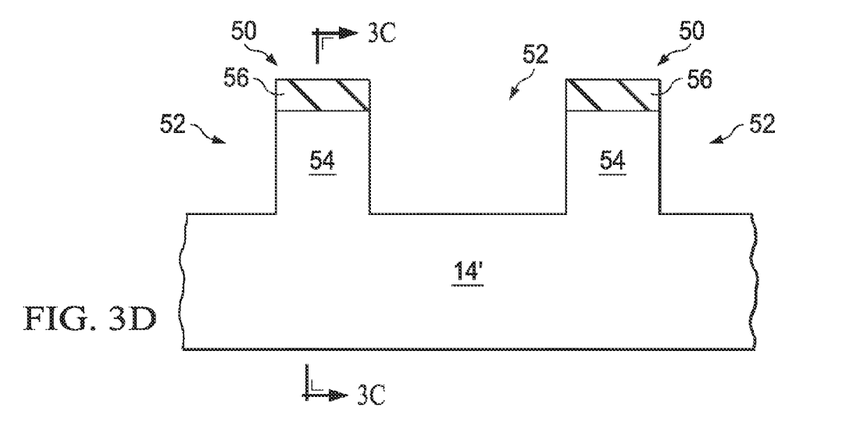

FIGS. 3C and 3D illustrate perpendicular cross-sectional views of the wafer 12'. A lithographic process as known in the art is used to define the fins 50 for the FinFET devices. The silicon nitride (SiN) layer 20 applied over the top surface of the wafer 12' is lithographically patterned in a manner known in the art to leave SiN mask material (cap 56) at the desired locations of the fins 50. An etching operation is then performed to open apertures 52 in the wafer 12' on either side of each fin 50. The apertures 52 further extend to a targeted depth in the layer 14' at least sufficient to define material for the fin. In a preferred implementation, the etching process may utilize a sidewall image transfer (SIT) process such as that described, for example, in U.S. Pat. No. 8,298,954, the disclosure of which is incorporated by reference.

Any suitable technique known in the art may then be used on the wafer 12' to form an insulating region 16 below each fin 50 so as to separate a region 54 made of semiconductor material layer 14' (with an overlying silicon nitride cap 56) from a bottom semiconductor substrate layer 18. For example, the known bottom oxidation through STIs (BOTS) technique or silicon on nothing (SON) technique may be used to form the insulating region 16. The result of the fin insulating process produces a structure as generally shown in FIG. 3B.

Given that the wafers 12 and 12' at this point have a same or very similar structure, the remainder of the process description will be provided with the understanding that the process started from either an SOI substrate wafer 12 or a bulk substrate wafer 12' (with a general reference being made to the "wafer") and continues from the structure illustrated in FIG. 3B.

Figure 4:
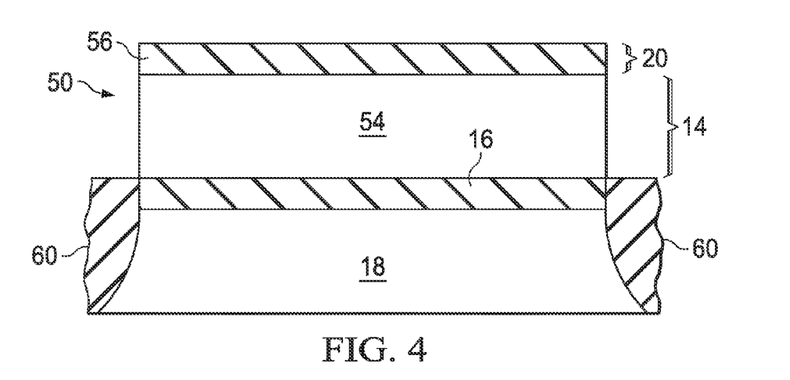

With reference to FIG. 4, a shallow trench isolation (STI) structure 60 is formed using conventional techniques well known to those skilled in the art. As an example, trenches may be formed in the insulating layer 16 and bottom semiconductor substrate layer 18 which surround active regions of the wafer. An etch, for example comprising a reactive ion bean etching process (RIE as known in the art), may be used to open the trenches. The trenches are then filled with an insulating material such as silicon dioxide using a high aspect ratio process (HARP) or tetraethylorthosilicate (TEOS) or flowable oxide process (known in the art) followed by a high temperature anneal for densification. In an embodiment as illustrated, the STI structure 60 may extend completely through the thickness of the bottom semiconductor substrate layer 18.

It will be understood by those skilled in the art that the STI structures 60 could alternatively be formed before defining the fins. However, STI formation before fin definition is not preferred as this may lead to issues with overlay. It is preferred to form the more dense structures (such as fins) first before forming other structures as this makes alignment easier.

Figure 5A:
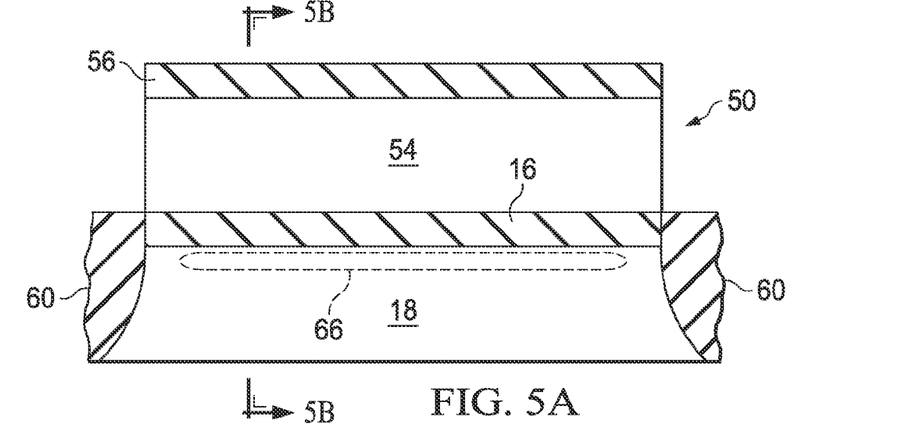
Figure 5B:
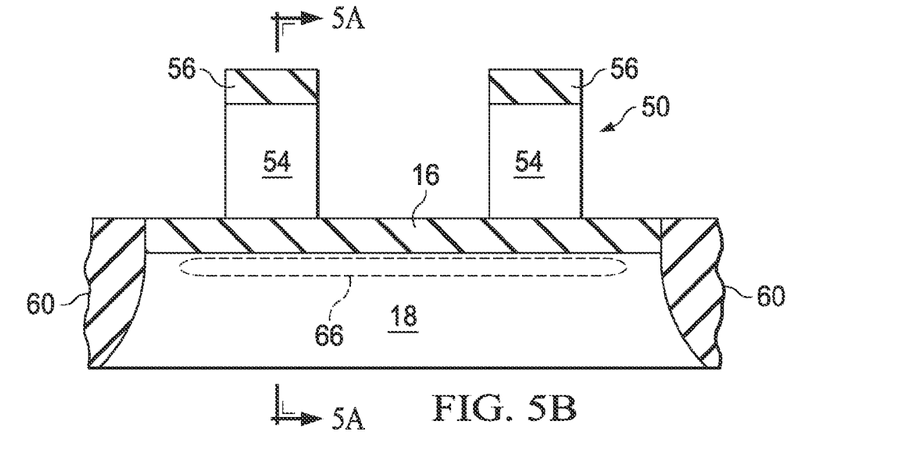

With reference to FIGS. 5A and 5B, a punch through stopper (PTS) implant 66 of arsenic, phosphorous, boron or indium dopant is made through the insulating layer 16 and into an upper surface of the bottom semiconductor substrate layer 18. For example, an ion beam implantation process may be used to achieve the implant 66. This implant 66 is important to the operation of any resulting FinFET device because the implant functions to suppress leakage between source and drain during normal operation of the device. For example, n-type implantation 66 is used for isolating on p-channel devices and p-type implantation 66 is used for isolating on n-channel devices.

Figure 6A:
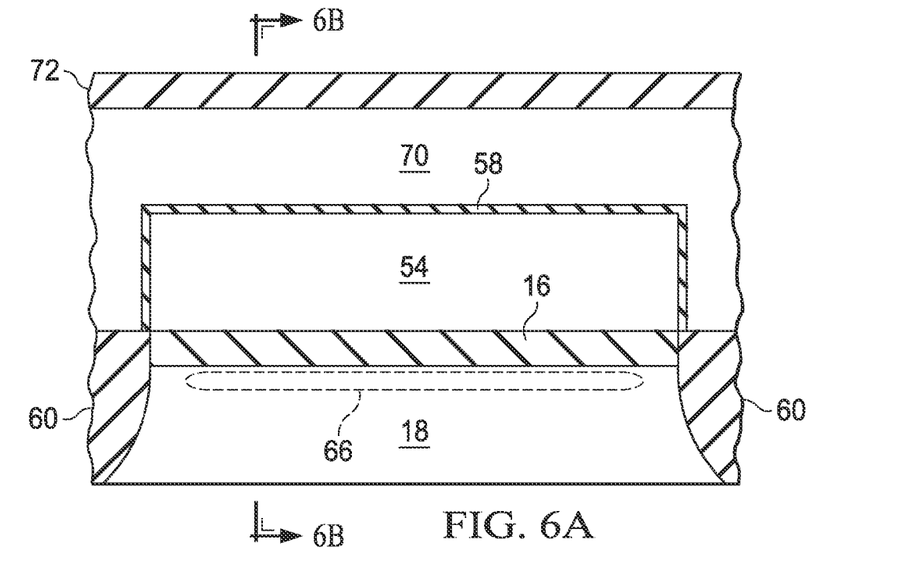
Figure 6B:
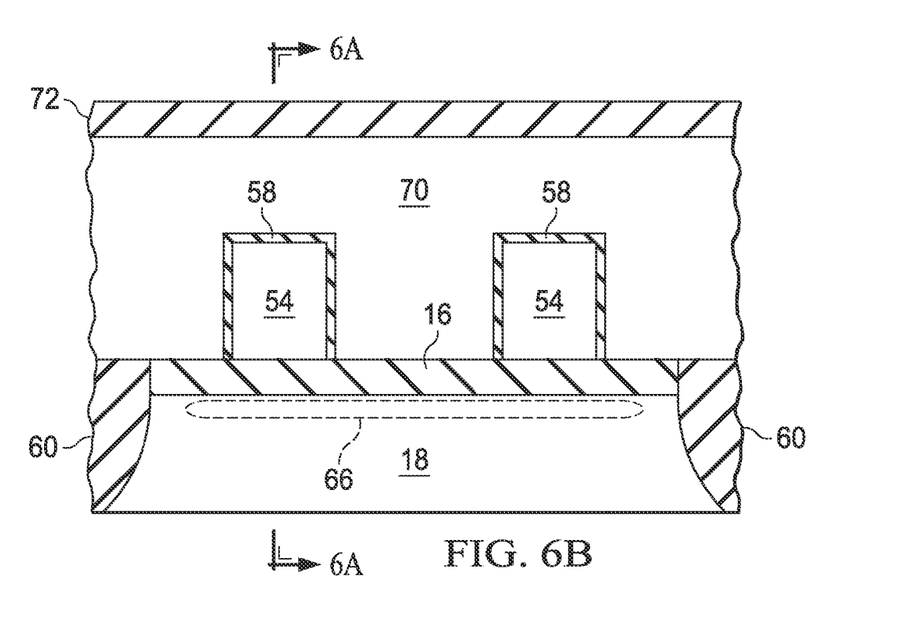

With reference to FIGS. 6A and 6B, after removal of the cap 56 (using, for example, a selective etch of $H_3PO_4$ for the SiN cap, HF or dry processing chemical oxide removal (COR) or SiCoNi for the $SiO_2$ cap), an oxide material layer 58 is formed on the exposed surfaces of the fin 54. This oxide layer 58 is deposited, for example, using low temperature atomic layer deposition (ALD), to form a gate oxide. A deposition process well known in the art such CVD is used to blanket deposit a layer of polysilicon 70 over the wafer. The material 70 may alternatively comprise amorphous silicon. Following planarization, for example using chemical mechanical polishing (CMP), a silicon nitride (SiN) layer 72 is deposited over the polysilicon layer 70.

As understood by those skilled in the art, the oxide layer 58 and polysilicon layer 70 are used to form structures known in the art as "dummy gate" structures. Accordingly, there is no need to dope the polysilicon 70 material. The dummy gate structures will be subsequently removed later in the fabrication process and replaced with a gate stack defining the actual operating gate electrode of the FinFET device.

Figure 7A:
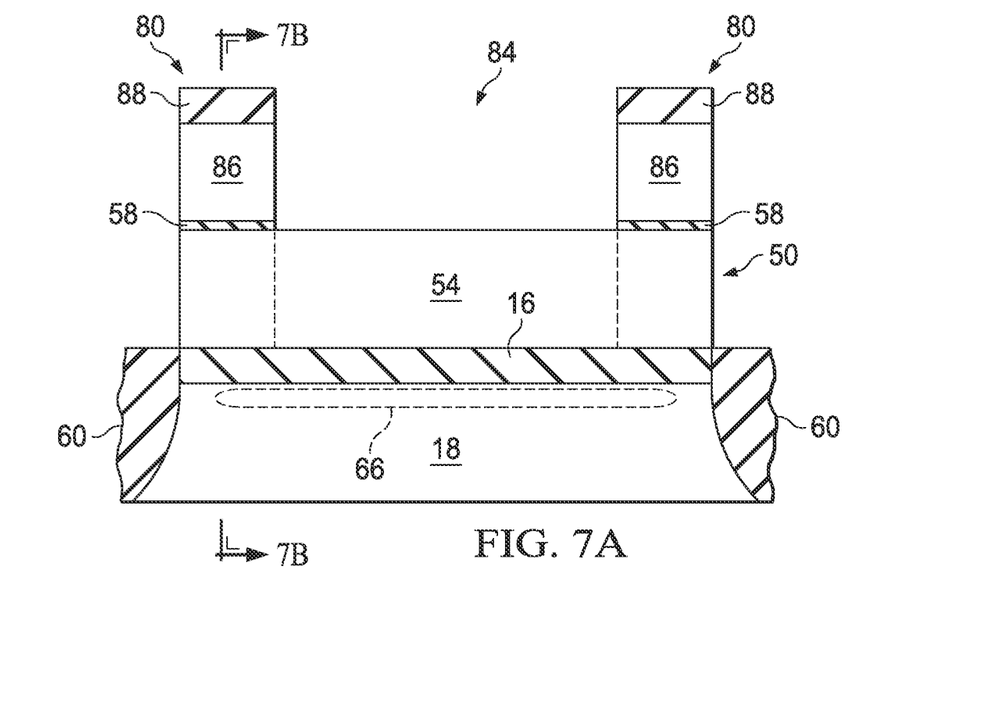
Figure 7B:
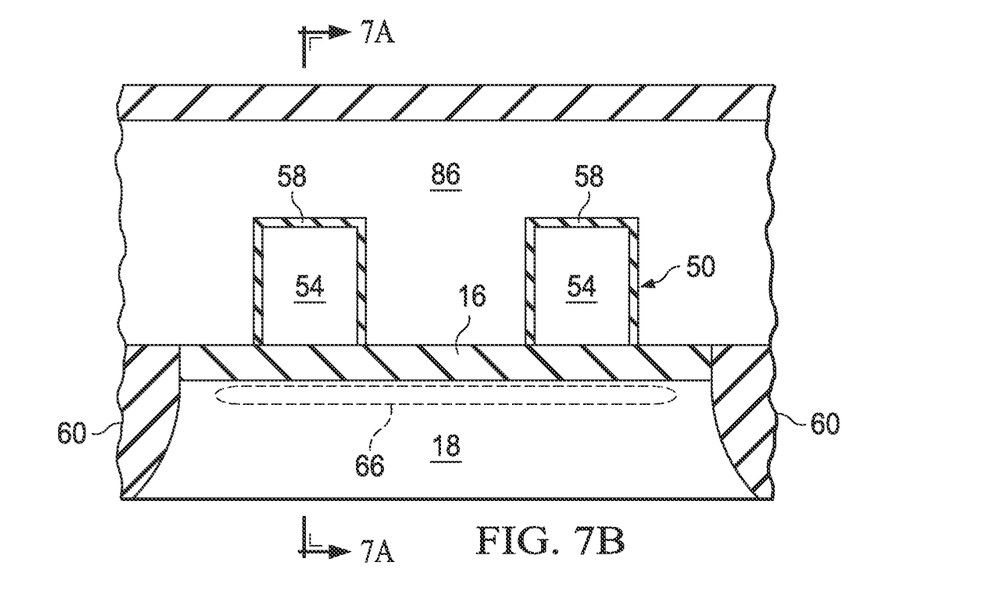

A lithographic process as known in the art is then used to define the dummy gate stack structures 80 for the FinFET devices. The silicon nitride (SiN) layer 72 applied over the top surface of the polysilicon layer 70 is lithographically patterned to leave SiN mask material 88 at the desired locations of the dummy gates. A reactive ion etching (RIE) operation is then performed to open apertures 84 in the polysilicon layer 70 on either side of each dummy gate 80. The apertures 84 extend to a depth sufficient to reach the insulating layer 16 and thus define separate dummy gate structures 80, but that etch does not remove the material of the fin 50 that is located between the dummy gate structures. Each dummy gate 80 is accordingly formed to include a region 86 made of the polysilicon layer 70 with an overlying silicon nitride cap 88. The result is shown in FIGS. 7A and 7B.

Figure 8:
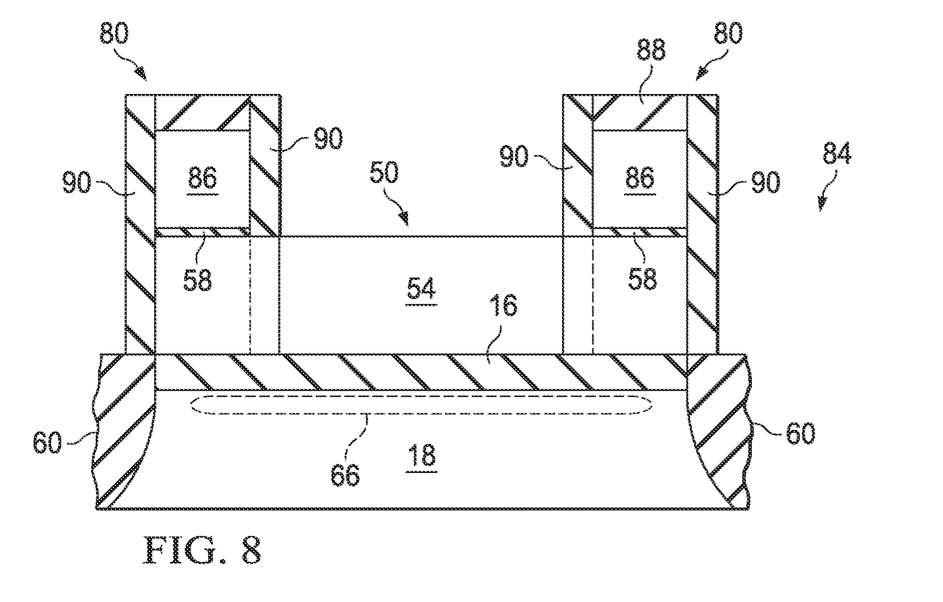

A silicon nitride (SiN) material 90 is then deposited (for example, using an atomic layer deposition (ALD) process at low temperature) on the side walls of the polysilicon material defining the dummy gate stack structures 80 to form sidewall spacer structures. The result is shown in FIG. 8.

Figure 9A:
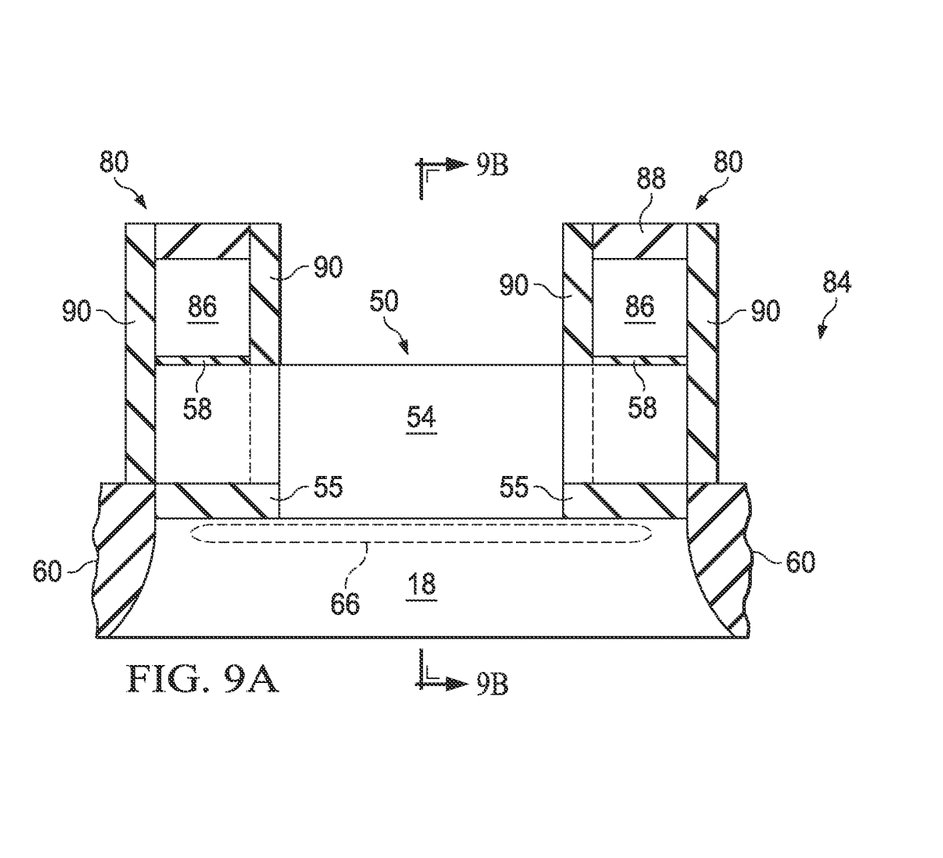
Figure 9B:
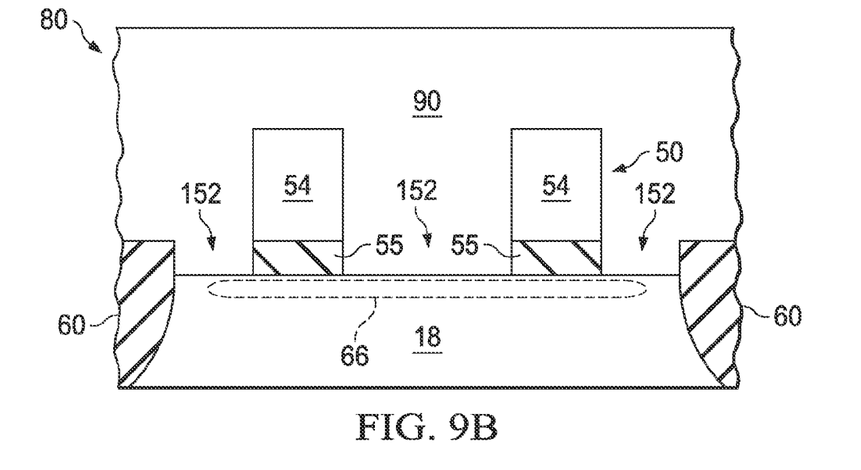
Figure 9C:
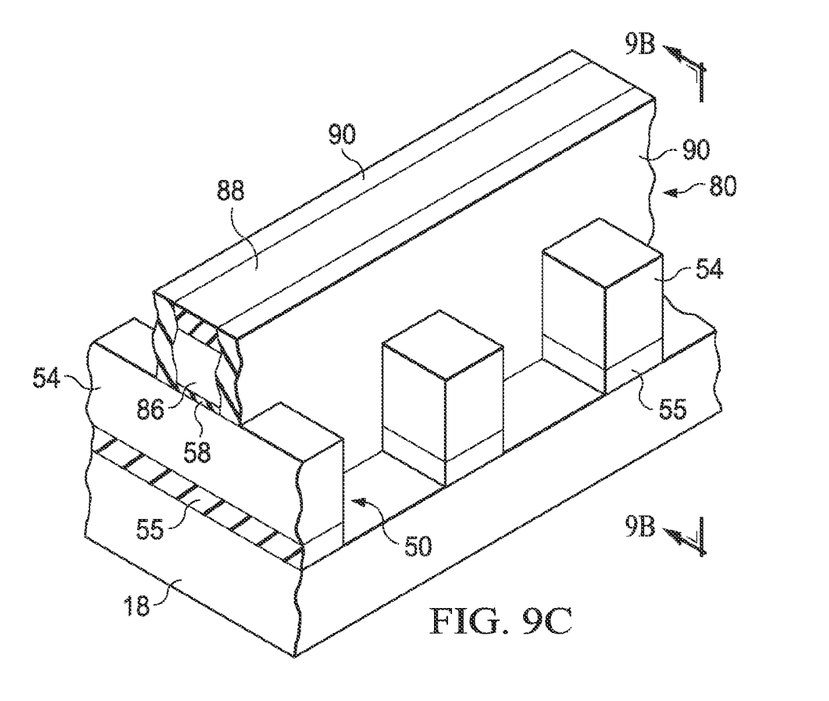

An etching operation is then performed to open apertures 152 in the insulating layer (BOX) 16 on either side of each fin 50 (again, without removing the material of the fin 50 between the dummy gate structures 80). The apertures 152 further extend to a depth sufficient to reach the bottom semiconductor substrate layer 18 (i.e., the apertures have a depth sufficient to pass completely through the insulating layer (BOX) 16). Each fin 50 in the area between dummy gate structures 80 is accordingly formed to include a region 54 made of the top semiconductor layer 14 (with layer 58) and a region 55 made of the insulating layer 16. In a preferred implementation, the etching process may comprise a reactive ion etch (RIE). The result is shown in FIGS. 9A, 9B and 9C (wherein FIG. 9C shows a perspective view of multiple fins under and next to a dummy gate structure).

Figure 10:
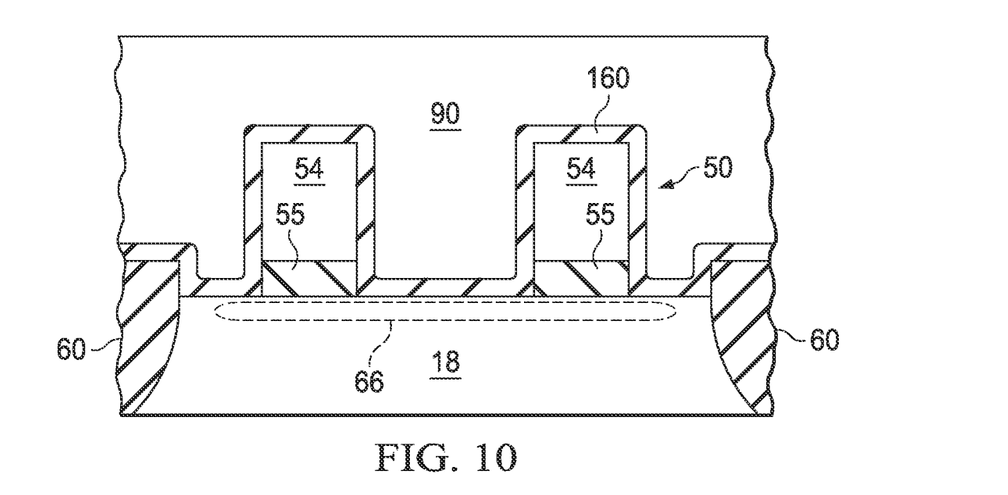

A silicon nitride (SiN) material 160 is then deposited (for example, using an atomic layer deposition (ALD) process at low temperature) on the top and sides of each fin 50 as well as over the exposed portions of the bottom semiconductor substrate layer 18 in the area of the wafer between dummy gate structures 80. The material 160 may, for example, form a layer with a thickness of about 6 nm. The result is shown in FIG. 10.

Figure 11:
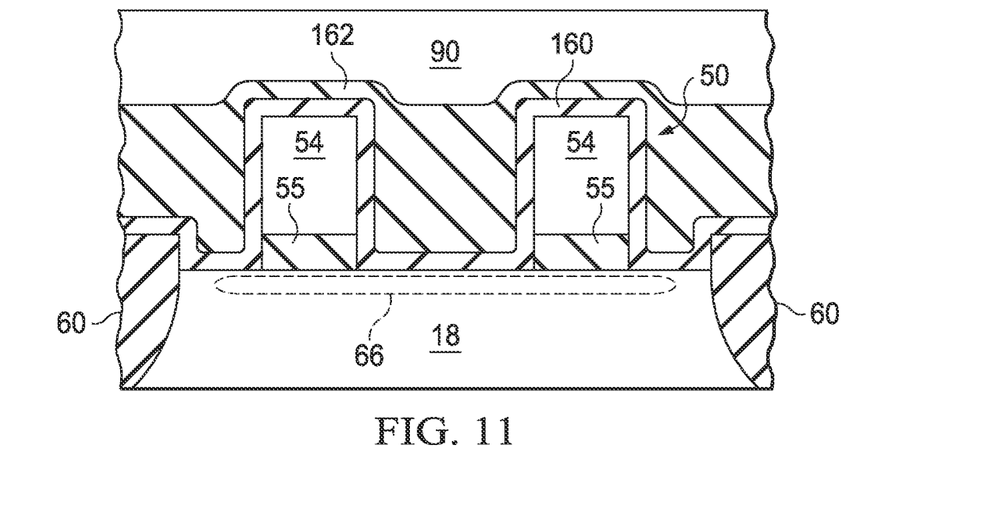

A silicon dioxide ($SiO_2$) deposit 162 is then made on the wafer to cover the layer of silicon nitride (SiN) material 160. The deposit 162 may, for example, form a layer with a thickness of about 10 nm. The result is shown in FIG. 11.

Figure 12A:
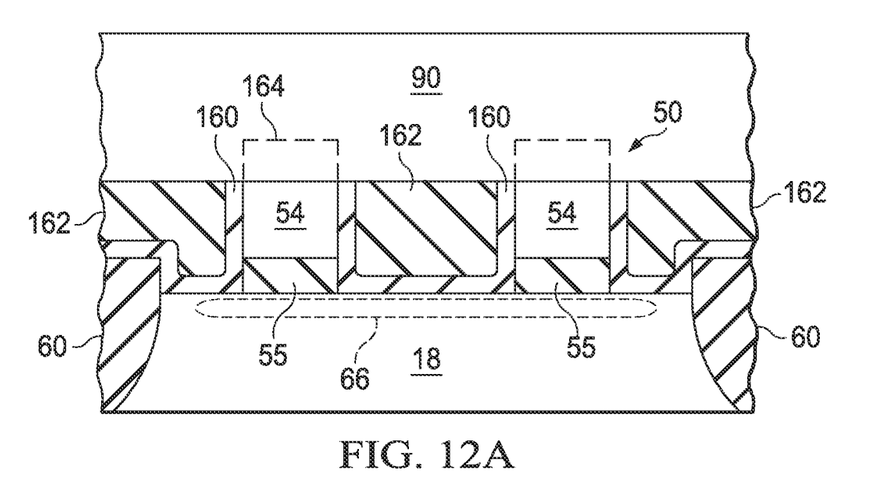
Figure 12B:
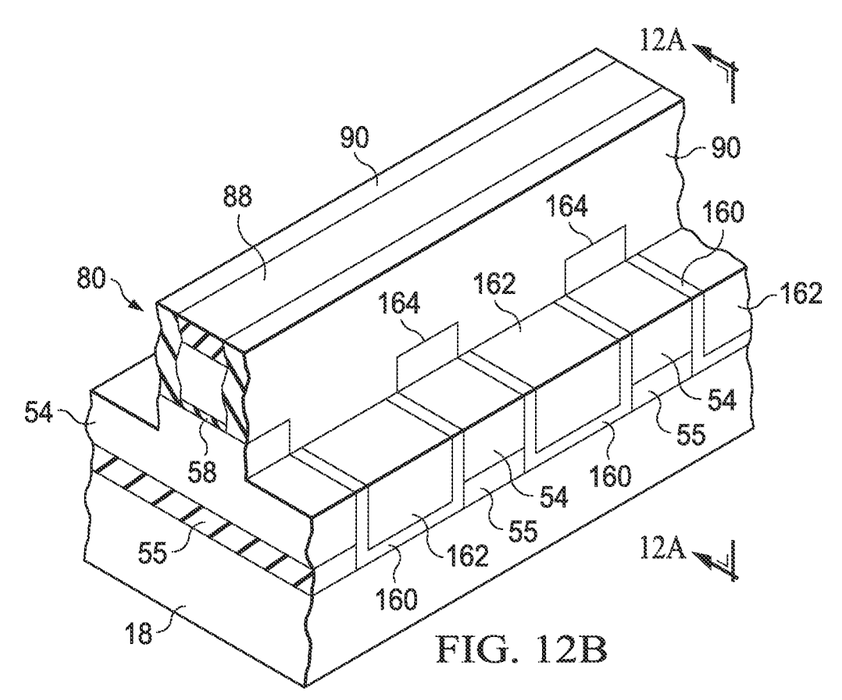

An etching operation is then performed to remove the silicon dioxide ($SiO_2$) deposit 162 and the silicon nitride (SiN) material 160 at the top of each fin 50 so as to expose the top of the region 54. The etching operation may comprise reactive ion etching (RIE). The result is shown in FIG. 12A. The dotted line 164 in FIG. 12A illustrates the original dimensions of the region 54 of the fin 50 and thus shows the location of the region 54 of the fin 50 under the gate structure (the oxide layer 58 is not shown). FIG. 12B shows a perspective view.

Figure 13A:
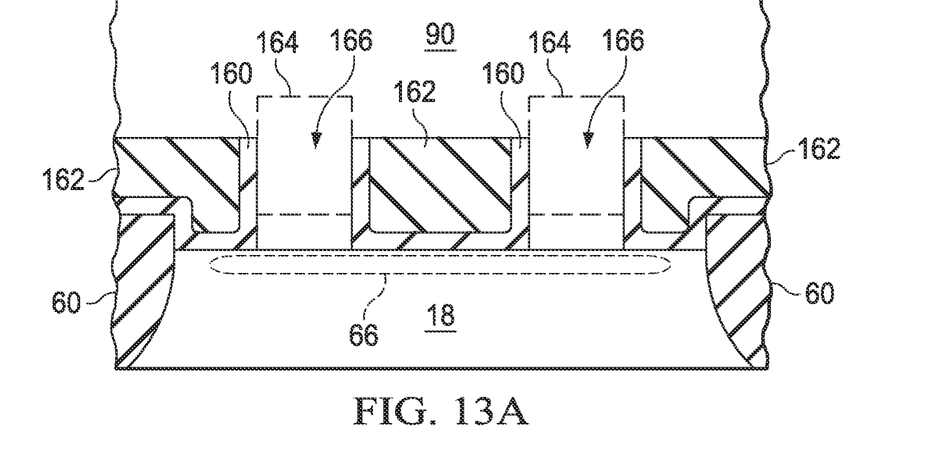
Figure 13B:
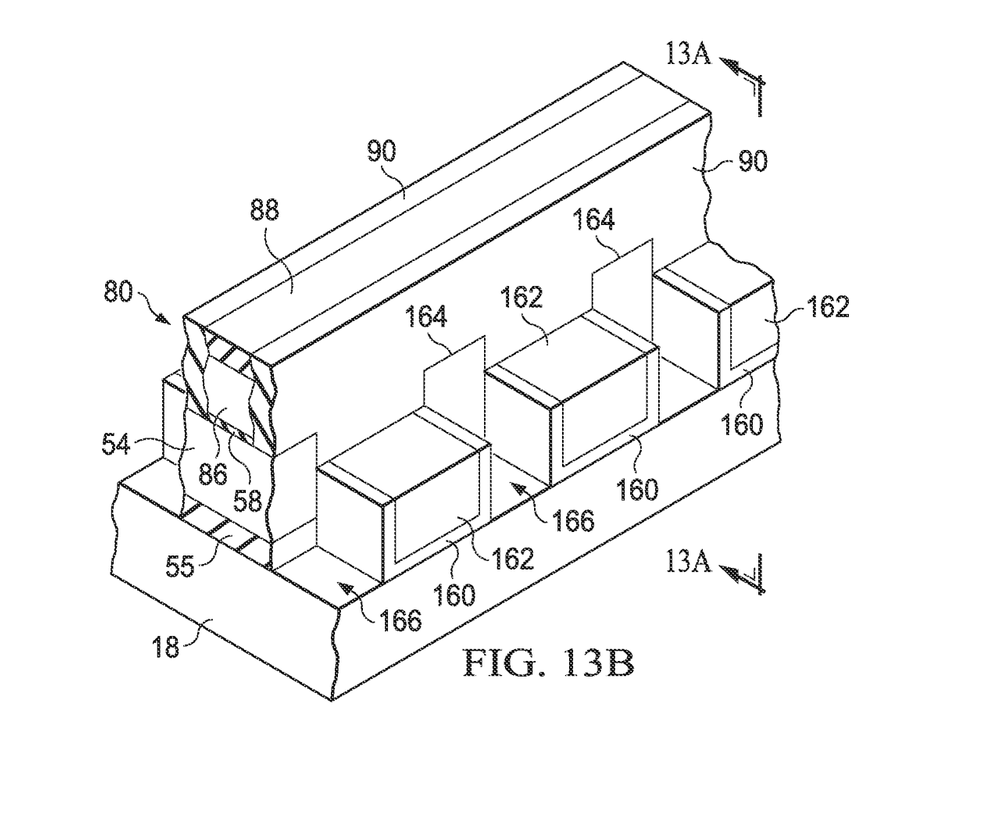

Another etching operation is then performed to remove the regions 54 and 55 of the fin 50 between the dummy gate structures so as to define a trench opening 166 which exposes the top surface of the bottom semiconductor substrate layer 18 (or substrate 14'). The etching operation is a directional etch (so as to not remove fin material under the gate dummy structures), wherein the etch is selective so as to not remove the silicon-nitride (SiN) layer on the sidewalls, and may comprise a wet HF etch or RIE process. The result is shown in FIGS. 13A and 13B (wherein FIG. 13B shows a perspective view). It will accordingly be noted that the trench openings 166 are aligned with the remaining regions 54 and 55 of the fin 50 underneath the dummy gate, where the regions 54 function as the channel regions of the FinFET transistor. Additionally, the trench openings have a substantially equal width with respect to the aligned channel region.

Figure 14A:
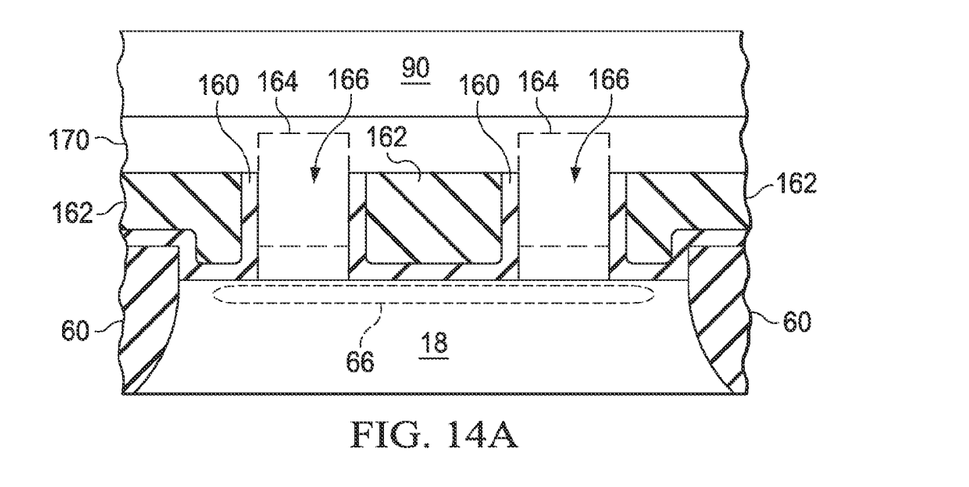
Figure 14B:
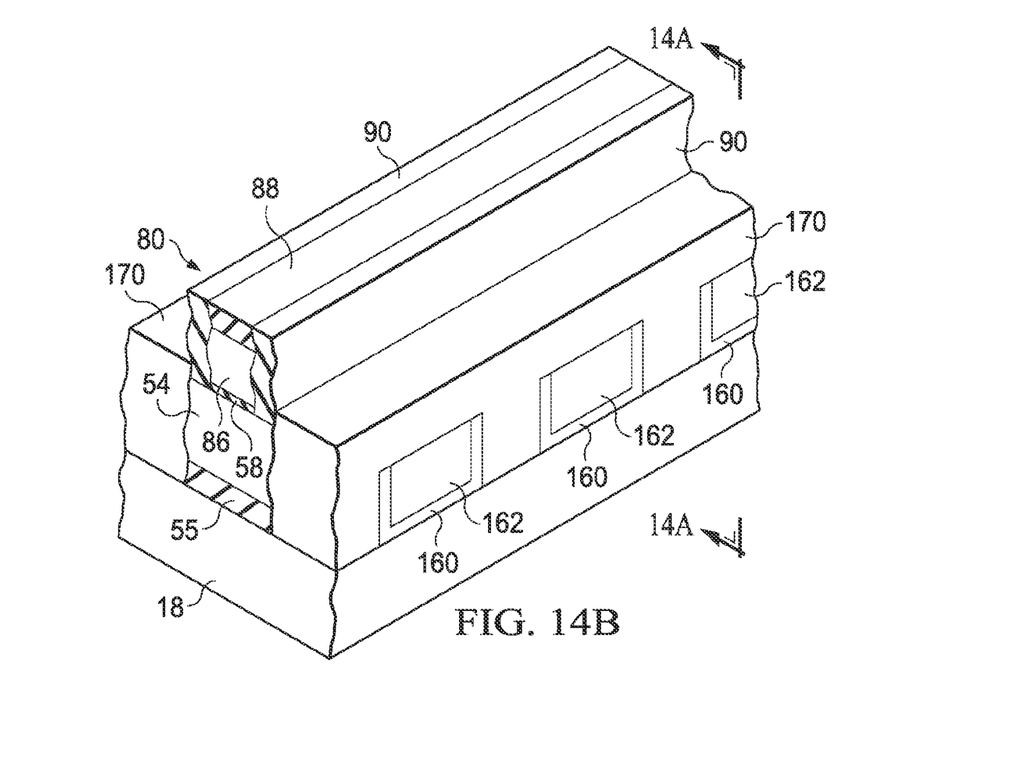

Using an epitaxial process tool and starting from the exposed top surface of the bottom semiconductor substrate layer 18 within each opening 164, an epitaxial growth 170 of silicon-based semiconductor material is made within each trench opening. The epitaxial growth 170 not only fills the trench openings 164 but may further spread to cover the wafer in the areas between the dummy gate structures. The silicon-based epitaxial growth is of a low resistivity with in-situ doping. For example, the growth may comprise: silicon doped with boron or silicon-germanium doped with boron. The epi growth 170 may alternatively comprise: silicon doped with phosphorus or silicon-carbide doped with phosphorus. The epi growth 170 may be continued until a height is reached which at least matches the height of the region 54 of the fin 50 under the dummy gate structure (see, dotted line 164). Importantly, it will be noted that the epi growth 170 touches the substrate layer 18 only within the opening 164 and is otherwise insulated from the substrate layer 18 by the silicon dioxide ($SiO_2$) deposit 162 and layer of silicon nitride (SiN) material 160. The result is shown in FIGS. 14A and 14B (wherein FIG. 14B shows a perspective view). The epi growth 170 accordingly defines source-drain regions in contact with the bottom semiconductor substrate layer 18 which are aligned with the channel regions defined by the remaining regions 54 and 55 of the fin 50 underneath the dummy gate structures.

The remaining steps performed to complete transistor fabrication include: 1) after completing the epitaxial growth, a thick oxide is deposited over the wafer; 2) a planarization process, such as CMP, is performed stopping on the dummy gate polysilicon material 86; 3) a selective removal process is performed to remove the dummy gate polysilicon material 86 and dummy oxide material 58; 4) the resulting opening is then filled with a gate stack; and 5) final contact processing is performed followed by back-end-of-line (BEOL) processing for metallization layer definition to finish fabrication of the device.

The process for FinFET formation disclosed herein is fully compatible with the formation of silicon-germanium (SiGe) fins. At the level of the layer 14 or 14', portions of the silicon substrate may replaced with SiGe regions. This can be accomplished in a number of ways known to those skilled in the art, including: SiGe deposition plus diffusion or condensation to make the SiGe regions. The remaining process steps as described above are then performed to fabricate fins of silicon material for n-channel devices and fins of silicon-germanium material for p-channel devices. By providing silicon regions and silicon-germanium regions on a same wafer, the process will support the formation of CMOS circuitry.

The process for FinFET formation disclosed herein possesses a number of advantages over prior art processes including: a) provision of control over the local isolation of the source-drain regions of the FinFET; b) the SiN layer covers the bottom substrate except at fin locations so as to ensure no local isolation loss during the epitaxy pre-cleans which remove the fin material between the gate structures; c) source-drain region surface area contact with the bottom substrate is reduced effectuating a corresponding reduction in source-drain leakage; d) the process is compatible with both a starting SOI substrate and a starting bulk substrate; e) lateral growth of the epitaxy for forming the source-drain regions is controlled by the SiN sidewalls.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A fin field effect transistor (FinFET) device, comprising:
   a plurality of elongated fins formed of a first semiconductor material and an insulating material, the first semiconductor material being separated from an underlying substrate material by the insulating material, said first semiconductor material defining a plurality of channel regions;
   an elongated gate formed of a second semiconductor material, said elongated gate extending to cross over the plurality of elongated fins at said channel regions, wherein said first semiconductor material and said insulating material of each of the elongated fins are not present on both a source side and a drain side of the elongated gate;
   a sidewall spacer on a side wall of both the source side and the drain side of said elongated gate;
   a protective material covering the underlying substrate material on the source side and the drain side of the elongated gate and including a plurality of trenches, with each trench of the plurality of trenches being adjacent to a corresponding one of the plurality of channel regions, the protective material comprising a plurality of portions separated from each other by the plurality of trenches, respectively, said protective material comprising:
      a nitride layer defining side walls of each trench of the plurality of trenches, said nitride layer extending over the underlying substrate material between adjacent trenches of the plurality of trenches; and
   an epitaxial semiconductor material including:
      first portions located inside said plurality of trenches respectively, the first portions defining a plurality of source/drain regions respectively, each of the first portions being adjacent to the corresponding one of said plurality of channel regions; and
      a second portion covering the protective material and connecting said first portions,
   wherein each of the first portions of the epitaxial semiconductor material directly contacts the underlying substrate material and the insulating material interposed between the underlying substrate material and the corresponding one of the plurality of channel regions, and
   wherein each of the portions of the protective material is embedded in the epitaxial semiconductor material and directly contacts the underlying substrate material.

2. The device of claim 1, wherein the elongated fins are supported by a bulk substrate.

3. The device of claim 1, wherein the elongated fins are formed from a silicon on insulator (SOI) substrate having an upper semiconductor layer made of the first semiconductor material, a bottom semiconductor layer providing the underlying substrate material and an interposed insulating layer providing said insulating material.

4. The device of claim 1, wherein the first semiconductor material is one of silicon or silicon-germanium.

5. The device of claim 1, wherein the second semiconductor material is polysilicon.

6. The device of claim 1, wherein the epitaxial semiconductor material inside said plurality of trenches is epitaxially grown from said underlying substrate material.

7. The device of claim 6, wherein the epitaxial semiconductor material is in-situ doped.

8. The device of claim 1, wherein said underlying substrate material includes a punch through stopper (PTS) implant located below the elongated gate and the plurality of elongated fins.

9. The device of claim 1, further comprising a shallow trench isolation structure surrounding the plurality of elongated fins.

10. The device of claim 1, wherein the elongated gate crosses over the plurality of elongated fins with a perpendicular orientation.

11. The device of claim 1, wherein each trench of the plurality of trenches is aligned with the corresponding one of the plurality of channel regions and wherein said each trench of the plurality of trenches has a width substantially equal to a width of said corresponding one of the plurality of channel regions.

12. A device, comprising:
a plurality of elongated fins including a first semiconductor material and an insulating material, the first semiconductor material being insulated from an underlying substrate material by the insulating material;
an elongated gate of a second semiconductor material, said elongated gate extending to cross over the plurality of elongated fins at a plurality of channel regions respectively;
a first sidewall spacer on a side wall of the elongated gate;
a protective material covering the underlying substrate material, said protective material comprising a nitride layer, the nitride layer defining second sidewall spacers on side walls of the plurality of elongated fins respectively, the nitride layer extending on both a source side and a drain side of the elongated gate, the protective material comprising a plurality of portions separated from each other by a plurality of trenches, respectively;
wherein the first semiconductor material and the insulating material of the plurality of elongated fins on the source side and the drain side of the elongated gate are recessed to form the plurality of trenches, each of the trenches being between a corresponding pair of the second sidewall spacers, said nitride layer extending over the underlying substrate material between adjacent trenches of the plurality of trenches; and
an epitaxial semiconductor material including:
first portions located inside the trenches respectively, the first portions defining a plurality of source/drain regions respectively, each of the first portions being adjacent to a corresponding one of the plurality of channel regions; and
a second portion covering the protective material and connecting said first portions,
wherein each of the first portions of the epitaxial semiconductor material directly contacts the underlying substrate material and the insulating material interposed between the underlying substrate material and the corresponding one of the plurality of channel regions, and
wherein each of the portions of the protective material is embedded in the epitaxial semiconductor material and directly contacts the underlying substrate material.

13. The device of claim 12, wherein the elongated fins are supported by a bulk substrate.

14. The device of claim 12, wherein the elongated fins are formed from a silicon on insulator (SOI) substrate having an upper semiconductor layer made of the first semiconductor material, a bottom semiconductor layer providing the underlying substrate material and an interposed insulating layer providing said insulating material.

15. The device of claim 12, wherein the first semiconductor material is one of silicon or silicon-germanium.

16. The device of claim 15, wherein the second semiconductor material is polysilicon.

17. The device of claim 12, wherein the epitaxial semiconductor material is grown from said underlying substrate material.

18. The device of claim 12, wherein the epitaxial semiconductor material is in-situ doped.

19. The device of claim 12, wherein said underlying substrate material includes a punch through stopper (PTS) implant located below the elongated gate and the plurality of elongated fins.

20. The device of claim 12, wherein said epitaxial semiconductor material is selected from the group consisting of silicon, silicon-germanium and silicon-carbide.

21. The device of claim 12, further comprising a shallow trench isolation structure surrounding the plurality of elongated fins.

22. The device of claim 12, wherein the nitride layer comprises a silicon nitride layer, and wherein the protective material comprises the silicon nitride layer and a silicon dioxide layer overlying the silicon nitride layer.

23. The device of claim 12, wherein each trench of the plurality of trenches is aligned with the corresponding one of the plurality of channel regions and wherein said each trench of the plurality of trenches has a width substantially equal to a width of said corresponding one of the plurality of channel regions.

* * * * *